June 20, 1967 T. J. GRENIER 3,327,234

LOW LEVEL LOW FREQUENCY AMPLIFIER

Filed Dec. 27, 1963 2 Sheets-Sheet 1

INVENTOR
T. J. GRENIER
BY John K. Mulcarney
ATTORNEY

United States Patent Office 3,327,234
Patented June 20, 1967

3,327,234

LOW LEVEL LOW FREQUENCY AMPLIFIER

Thomas J. Grenier, Mine Hill, N.J., assignor to Bell Telephone Laboratories, Incorporated, New York, N.Y., a corporation of New York Filed Dec. 27, 1963, Ser. No. 334,050
10 Claims. (Cl. 330—10)

ABSTRACT OF THE DISCLOSURE

Two voltage-sensitive oscillators with different output frequencies are coupled through a modulator to a discriminator which detects variations in the difference frequency. An input signal deviates the frequencies of the oscillators in opposite directions thereby producing an amplified version of the input signal at the output of the discriminator. An automatic frequency control loop is connected between the output of the discriminator and the two oscillators.

This invention relates to amplifiers, and more particularly to an amplifier for amplifying low level, low frequency signals.

The amplification of signals of very low frequencies and very low levels, such as originate in a hydrophone, has long presented a problem. Direct amplification at the signal frequency generally results in the addition of noise of intolerable levels to the signals; accordingly, alternative techniques of amplification have been developed. One such technique is to have the very low frequency signal frequency-modulate a high frequency oscillator, the output of which is then frequency multiplied in order to increase the amount of frequency deviation and then detected in order to recover the original signal. Such a technique, however, substantially degrades the signal to noise ratio since the multiplier circuits add substantial amounts of noise and distortion. An improved technique of amplification is to have the applied signal frequency-modulate two high frequency oscillators in the opposite sense so as to obtain a beat frequency with twice the frequency deviation of either oscillator. In this way, the desired signals from each of the oscillators add on an algebraic basic to produce a beat frequency with twice the deviation, whereas the undesired noise signal from each of the oscillators add on an R.M.S. basis thereby contributing little degradation to the signal to noise ratio. Unfortunately, however, a constant difference frequency must be maintained, and to do so, prior art F.M. systems have utilized crystal controlled high frequency oscillators. Although this type of oscillator is stable, it unfortunately requires a large signal for a given frequency deviation.

The primary object of the present invention is to amplify low level, low frequency signals.

A further object of the present invention is to provide a highly sensitive, low noise amplifier wherein two high frequency oscillators are frequency modulated in the opposite sense to produce a much greater frequency deviation for a given applied signal than do oscillators which are crystal controlled.

These and other objects are attained in the present invention wherein each of two high frequency oscillators is provided with a pair of varactor tuning elements. The pairs are oppositely poled and supplied in parallel with the low frequency signal to be amplified. Thus the frequency of each oscillator is deviated by the signal, and the deviations are of opposite senses. The outputs of the oscillators are added, amplified, and intermodulated to provide a beat frequency carrying the double deviation.

A discriminator recovers the amplified signal and also supplies an AFC signal by way of a single wire to the control points of the two varactor pairs. Opposite poling of the two varactor pairs causes each oscillator to substantially track the spurious frequency deviations of the other so that only a small amount of AFC by way of the feedback loop is required. This permits the AFC path to be a very high impedance, thereby holding the amount of noise developed in the varactors, as a result of the thermal noise from the AFC path, to a minimum level.

Other objects and attendant advantages will be apparent from the following description of the invention taken in connection with the accompanying drawings in which.

Figure 1:
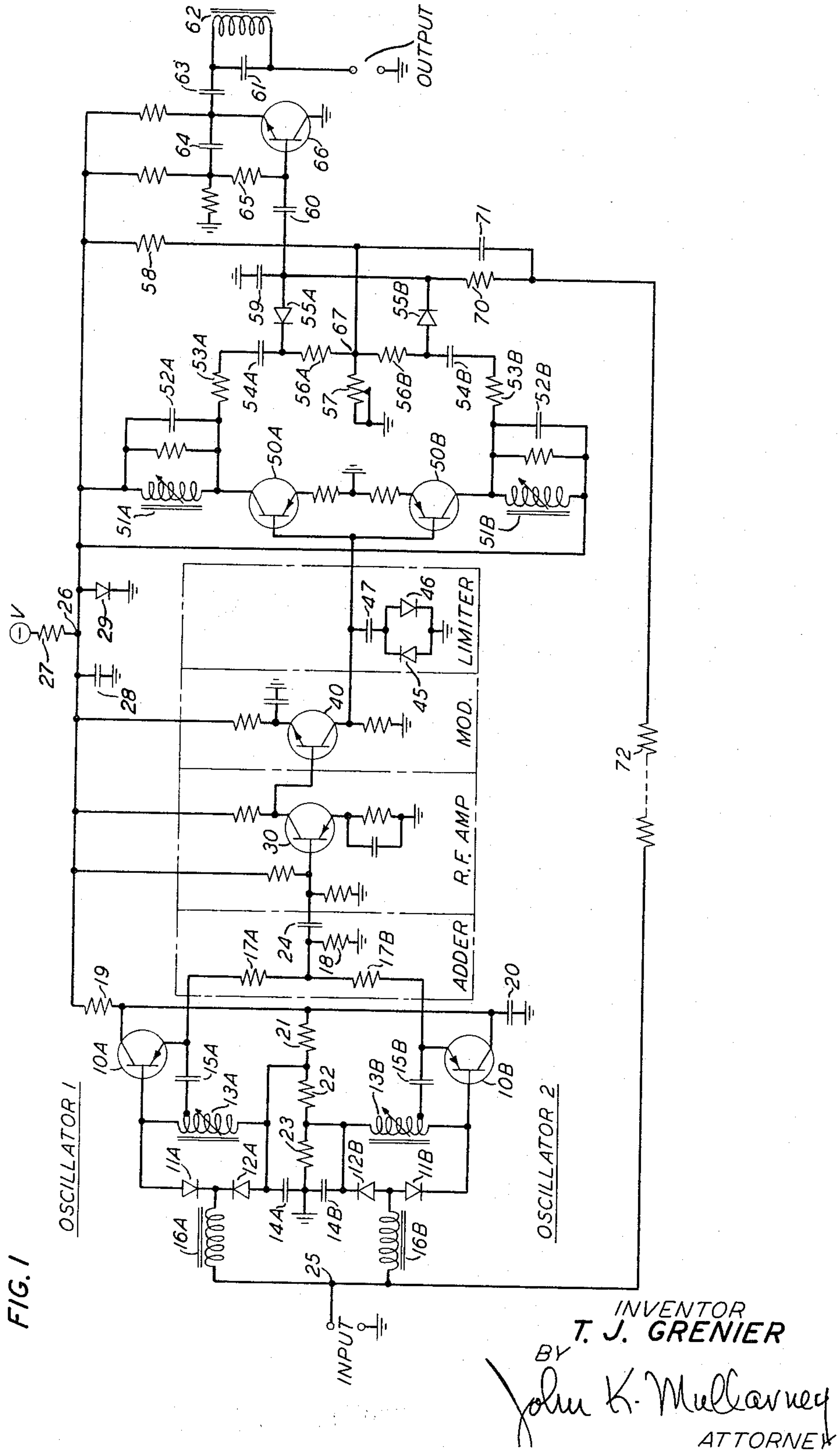
FIG. 1 is a schematic circuit diagram of an amplifier constructed in accordance with the present invention.

Referring now to FIG. 1 of the drawings, back-biased varactors 11A and 12A are connected in parallel with the inductance 13A to form the resonant tank circuit of an oscillator, designated in FIG. 1 as Oscillator 1. One end of inductance 13A is connected to the base of transistor 10A, the other end is bypassed through capacitor 14A to reference potential, and a tap on inductance 13A is coupled through capacitor 15A to the emitter of transistor 10A. The collector of transistor 10A is bypassed to reference potential through capacitor 20 thereby completing an A.C. connection through to the tank circuit and forming the well-known Hartley oscillator configuration.

Transistor 10B is connected in an almost identical circuit configuration to form the oscillator designated as Oscillator 2, the only differences in circuitry being that varactors 11B and 12B are oppositely poled with respect to their associated inductance 13B as compared with the varactors 11A and 12A, and that inductance 13B is connected to the junction of resistors 22 and 23, a point of lower negative D.C. potential than the point to which inductance 13A is connected. The Oscillators 1 and 2 can be assumed to operate at frequencies of 1.025 mc. and .975 mc. respectively.

The collectors of transistors 10A and 10B are connected together and supplied with their D.C. operating potentials through resistor 19 from point 26. The potential of point 26, from which point all circuits in the amplifier are supplied with their D.C. operating potentials, is advantageously derived from an available negative potential source V connected through the decoupling network composed of resistor 27 and capacitor 28. A back-biased Zener diode 29 is connected between point 26 and reference potential to provide for voltage regulation. Resistor 19 is sufficiently high in value so as to limit the operating potentials on oscillator transistors 10A and 10B to a very low value, for the following reasons: first, it has been experimentally observed that the noise contributed to the circuit by the oscillators is very much reduced when the operating potentials are quite low (in the order of 1.4 volts collector to ground); and second, such operation will result in very low amplitude high frequency signals (about 0.2 volt peak to peak). The latter result allows the varactors to be advantageously operated at a very low value of back-bias voltage (about 0.1 volt) thereby achieving a high sensitivity, that is, a large change in capacitance for a change in applied voltage. Since the amplitude of the oscillations is low, excessive rectification of the oscillator signal will not take place even though the back-bias is low. It should be noted at this point that some rectification is permitted to occur and is desired in connection with the internal tracking to be hereinafter described.

The junction of varactors 11A and 12A and the junction of varactors 11B and 12B are connected through inductors 16A and 16B respectively to input point 25. A negative D-C bias potential is supplied to the junction of both sets of varactors through feedback resistor 72, the potential being advantageously set, in a discriminator circuit hereinafter described, to be substantially midway between the potential at the junction of resistors 21 and 22 and the potential at the junction of resistors 22 and 23. Consequently, both sets of varactors are back-biased to about the same potential and are therefore equally sensitive to the input signals connected to point 25.

In connection with this bias potential supplied through feedback resistor 72, it should be noted that the D-C resistance of the inpuit signal source should not have a loading effect. A signal source whose impedance is primarily capacitive with high D-C leakage resistance, such a hydrophone which has about 0.03$\mu$fd. and greater than 1000 megohms of leakage resistance, may be connected directly to the input. Signal sources having an impedance with a significant D-C resistance should be isolated by means of a blocking capacitor.

As indicated hereinabove, the high frequency oscillators are adjusted to have a set difference frequency between them (e.g., 50 kc.). Inductors 16A and 16B isolate the oscillators from each other and from the input at the oscillator frequencies, but allow the much lower input signal frequencies (e.g., from 10 c.p.s. to several kc.) to pass from the input to each of the varactor junctions. As is well known in the art, the capacity of a back-biased varactor diode varies inversely with the magnitude of the back-bias voltage. Accordingly, the positive swing of an input signal will cause varactors 11A and 12A to be further back-biased thereby decreasing their capacity and raising the frequency of Oscillator 1. The same positive swing of the input signal will cause varactors 11B and 12B to be less back-biased thereby increasing their capacity and lowering the frequency of Oscillator 2. The negative swing of an input signal correspondingly causes frequency deviations in each of the oscillators but in a different direction, that is, a decrease in the frequency of Oscillator 1 and an increase in the frequency of Oscillator 2. Since the frequency deviations of the oscillators are of opposite senses, the difference frequency will undergo deviations equal to the sum of the deviations in each of the oscillators.

Output signals are taken from Oscillator 1 and Oscillator 2 at the emitters of their respective transistors and delivered to resistors 17A and 17B. The resistive network composed of 17A, 17B, and 18 connects the two signals to a common point thereby forming a single composite signal while providing sufficient isolation between the oscillators so as to prevent interaction. Capacitor 24 couples the composite signal made up of both oscillator signals from the common point junction of resistors 17A, 17B and 18 to the base of transistor 30 which operates as a conventional amplifier in common emitter configuration. This stage serves to raise the level of both oscillator signals in order to obtain a high level beat frequency signal from the modulator stage which follows. The output of the amplifier is taken from the collector and coupled directly to the base of transistor 40. Transistor 40 is operated very near cutoff and therefore it amplifies the composite signal in a nonlinear fashion, thereby intermodulating the two oscillator signals and causing an intermediate frequency (I.F.) signal to appear at its collector. The signal at the collector of transistor 40 is amplitude limited by the parallel combination of oppositely poled diodes 45 and 46 which are connected between the collector and reference potential through coupling capacitor 47.

The collector of transistor 40 is also connected to the base electrodes of transistors 50A and 50B which are connected in common emitter configuration as selective amplifiers at frequencies in the vicinity of the difference frequency. The tank circuit composed of inductor 51A and capacitor 52A is connected to the collector of transistor 50A and is adjusted to peak at a frequency slightly higher than the no-input intermediate frequency. A similar tank circuit composed of inductor 51B and capacitor 52B is connected to the collector of transistor 50B and is adjusted to peak at a frequency slightly lower than the no-input intermediate frequency. The peaking frequencies of the latter two tank circuits should be far enough away from the no-input intermediate frequency so as to include all frequencies to which the difference signal may deviate as a result of the application of an input signal to the amplifier.

The collector of 50A and the collector of 50B are connected respectively through isolation resistors 53A and 53B, which prevent loading of the tank circuits by the circuits that follow, and through coupling capacitors 54A and 54B to the load resistors 56A and 56B. Diode 55A is connected to the junction of capacitor 54A and resistor 56A and is properly poled so as to pass the negative swings of the signal which is amplified by transistor 50A. A similar diode, designated 55B, is connected to the junction of capacitor 54B and resistor 56B but oppositely poled so as to pass the positive swings of the signal which is amplified by transistor 50B.

Assuming now for the moment that there is no signal applied to the input of the amplifier circuit and that the high frequency oscillators are operating at frequencies such that the frequency of the I.F. signal lies midway between the frequencies at which the tank circuits in the collectors of transistors 50A and 50B are peaked. Under these conditions the negative peaks passed by diode 55A to capacitor 59 are equal but opposite in polarity to the positive peaks passed by diode 55B. Accordingly, there is substantially no change in the D-C or low frequency voltage across capacitor 59. On the other hand, if an input signal is applied to the circuit, the intermediate frequency signal will deviate toward one of the peak frequencies of the tank circuits, thereby causing one of the diodes to pass peaks of greater magnitude than those passed by the other. Accordingly, the signal across capacitor 59 will have a low frequency component whose amplitude is a function of the frequency deviations of the I.F. signal which are, in turn, a function of the applied input signal. Hence one of the functions performed by that portion of the circuit between the base electrodes of transistors 50A and 50B and the junction of diodes 55A and 55B is similar to that performed by a conventional discriminator.

The signal on capacitor 59 is coupled through capacitor 60 to the base of transistor 66 which is connected in a common collector configuration for the purpose of providing an impedance transformation from the discriminator circuit to a low impedance load at the output. Capacitor 63 connects the emitter of transistor 60 to the output terminals through a parallel resonant circuit composed of capacitor 61 and inductor 62. The latter resonant circuit is tuned to the intermediate frequency in order to block those I.F. components which remain in the signal from reaching the output. A small amount of positive feedback (less than the amount which would cause oscillation, of course) is provided through capacitor 64 and resistor 65 in order to increase the input impedance of the common collector stage and thereby decrease the loading effect on the discriminator.

The D.C. potential across capacitor 59 is substantially the same as that across variable resistance 57 since capacitor 59 is direct current connected to point 67 via diode 55A and resistance 56A. The value of the negative D.C. potential across capacitor 59 can therefore be changed by adjusting variable resistor 57. This D.C. potential on capacitor 59 is directly coupled through resistors 70 and 72 to point 25 and, as indicated hereinbefore, is adjusted to a potential about midway between the potentials at the junction of resistors 21 and 22 and the junction of resistors 22 and 23.

As stated hereinabove, there is no D.C. contribution to capacitor 59 by the peaks of the I.F. signal when the latter is located midway between the peaking frequencies of the discriminator's resonant circuits. On the other hand, if the I.F. signal is not midway between the above-mentioned peaking frequencies, the persistently greater magnitude of the peaks delivered by one of the diodes, 55A or 55B, as compared with the other will cause a change in the D.C. component across capacitor 59 which will, in turn, cause a change in the frequencies of the high frequency oscillators so as to recenter the I.F. signal. For example, assume that Oscillator 1 has been adjusted to a frequency higher than that of Oscillator 2 and for some reason has drifted to an even higher frequency thereby producing an I.F. signal which is higher in frequency than desired. Transistor 50A, having the higher frequency tank circuit, will pass a larger signal to diode 55A than the signal which is passed by transistor 50B to diode 55B. Hence, the D.C. component of the signal across capacitor 59 increases the negative D.C. potential supplied to point 25 causing varactors 11A and 12A to be less back-biased and varactors 11B and 12B to be more back-biased thereby lowering the frequency of Oscillator 1 and raising the frequency of Oscillator 2, the net result being a decrease in the frequency of the I.F. signal.

The alternating potential that is developed across the capacitor 59 as a result of an applied input signal has no effect on the potential at point 25 since the same is eliminated or blocked by the very, very low-pass network composed of capacitor 71 (approximately .01 mfd.) and resistors 70 and 72 (approximately 200 megohms). It should be noted at this point that capacitor 71 is not connected with one side to common or reference potential as might be expected. To do so would not only require that capacitor 71 initially charge through high valued resistor 70, but even more importantly, that the potential at point 25 would initially be zero. Under these conditions, the high frequency oscillators may initially not operate at all, and even when they do, they will do so at frequencies vastly different from their final operating frequencies thereby requiring a large correction via the feedback loop and a long period of time before the circuit settles down to the proper operating frequencies. In the present invention, the oscillators begin operating at very nearly the correct frequency since capacitor 71 is advantageously returned to the junction of resistors 57 and 58, thereby causing the same D.C. potential to initially appear across both plates of the capacitor and a potential very nearly or exactly, equal to the operating potential to initially appear at point 25.

Since the loading effect on the input, and the amount of thermal noise contributed to the input by the feedback resistor are both decreased with an increase in the value of feedback resistance, it is highly desirable from the standpoint of achieving maximum sensitivity to have as high a value of feedback resistance as possible. On the other hand, the higher the value of feedback resistance, the less effective is the feedback loop in correcting for drifts in the frequency of the high frequency oscillators. In the present invention the feedback resistance has a much higher value than is ordinarily possible because of interaction between the oscillators which causes each oscillator to track the spurious frequency deviations of the other.

Figure 2:
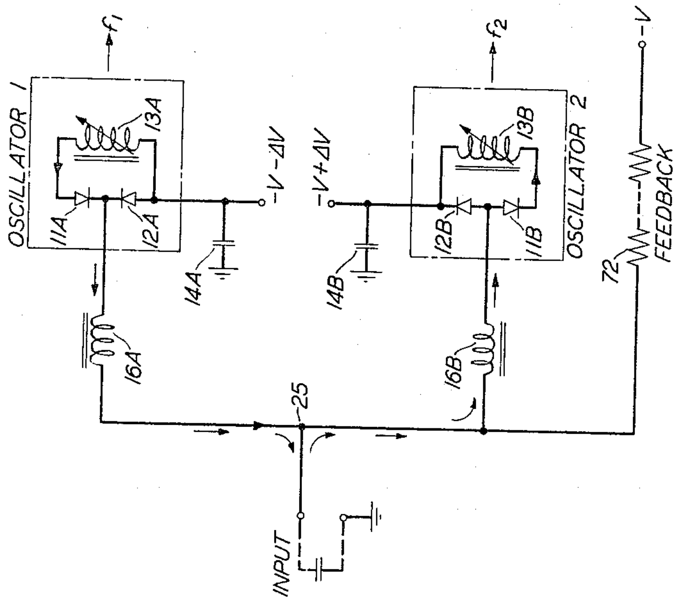
FIG. 2 is a simplified schematic diagram useful in explaining how each oscillator is caused to substantially track the spurious frequency deviations of the other.

Referring now to FIG. 2, a simplified circuit diagram is shown which is useful in explaining the tracking of each oscillator with the other. As indicated above, the varactors are operated with a very low back-bias voltage in order to achieve maximum sensitivity. Even though the oscillators are operated at very low operating potentials and therefore produce very low amplitude oscillations, the oscillations are nevertheless large enough to cause some rectification to take place. The most positive portions of the signal across the tank circuit of Oscillator 1 forward bias diode 11A and are filtered by inductor 16A and the capacitance of the input source to produce a small positive potential at point 25. The most negative portions of the signal across the tank circuit of Oscillator 2 forward bias diode 11B and are filtered by inductor 16B and the capacitance of the input source to produce a small negative potential at point 25. Hence, Oscillator 1 produces a potential which subtracts from, and Oscillator 2 produces a potential which adds to, the negative potential supplied to point 25 via the feedback path. As long as the magnitude of the oscillations in each oscillator remains the same, no change in the potential at point 25 will occur.

It has been experimentally observed however, that the magnitude of the oscillations in each of the high frequency oscillators is inversely proportional to frequency. Hence, an increase in the Oscillator 1 operating frequency, $f_1$, results in a decrease in the magnitude of the signal across inductor 13A, which causes a decrease in the amount of positive potential produced at point 25, as described, which, in turn, results in an increased net negative potential at point 25. This increased negative potential causes varactors 11B and 12B to be further back-biased, thereby decreasing the capacitance across inductor 13B and causing an increase in the Oscillator 2 operating frequency $f_2$. Consequently, the difference or intermediate frequency $(f_1-f_2)$, tends to remain the same even though Oscillator 1 has undergone a spurious frequency change. Similar tracking occurs for a decrease in the frequency of Oscillator 1 and for changes in the frequency of Oscillator 2. Consequently, the amount of automatic frequency control required by way of the feedback loop is reduced, and feedback resistor 72 may be advantageously increased in value.

Figure 3:
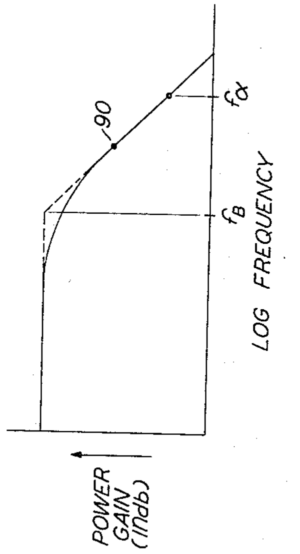
FIG. 3 is a curve, for a junction transistor, of power gain in db versus frequency, the same being useful in conjunction with the explanation of FIG. 2.

A theoretical explanation for the above-mentioned experimentally observed phenomenon can be given in connection with the curve shown in FIG. 3 of Power Gain (in db) versus Frequency. The power gain of a junction transistor is down 3 db at a frequency, $f_B$, well before the cut-off frequency, $f_\alpha$. See, for example, page 212 in the text "Principles of Transistor Circuits" by R. F. Shea, John Wiley and Sons, Inc. (1953). The power which an oscillator can deliver to a load is directly proportional to power output available from the active device being used. The frequencies of the oscillators in the present invention are such that transistors 10A and 10B are operated at a point, such as 90, which is situated on that portion of the power gain versus frequency curve which has a substantial negative slope. Accordingly, a change in frequency produces an inverse change in the amount of power available at the load and hence a similar inverse change in the amount of voltage across the same.

What has been described hereinbefore is a specific illustrative embodiment of the principles of the present invention. It is to be understood that numerous modifications of circuitry and component parts may be utilized without departing from the spirit of the invention. For example, it will be readily appreciated that the output of each high frequency oscillator can be amplified first and then added together at the input of the modulator. In addition, many other changes, such as in the polarity of the supply potential with corresponding changes in the poling of appropriate diodes and in transistor types, are obviously possible. Furthermore, the output stage may be modified to match the discriminator to a specific load.

Accordingly, it is to be understood that the above-described arrangement is illustrative of the application of the principles of the present invention and numerous modifications thereof may be devised by those skilled in the art without departing from the spirit and scope of the invention.

What is claimed is:

1. An amplifier for developing an amplified replica of a low level, low frequency signal comprising a first high frequency oscillator which includes an active element and a frequency-determining tank circuit constituted of a first inductance and a first pair of varactors of which the anodes are connected to the terminals of the inductance and the cathode are connected together, a second high frequency oscillator which includes an active element and a frequency-determining tank circuit constituted of a second inductance, and a second pair of varactors of which the cathodes are connected to the terminals of the second inductance and the anodes are connected together, said tank circuits being tuned so as to cause the oscillations of the first oscillator to differ in frequency from those of the second oscillator by a desired intermediate frequency, means for providing a slight back-bias to said varactors, means for applying a low level, low frequency input signal in parallel to the junction points of both said varactor pairs whereby a signal voltage increment produces frequency deviations of opposite senses in the frequencies of said oscillators, means for intermodulating the oscillator output frequencies to develop an intermediate frequency signal having signal-controlled doubled frequency deviations, discriminator means for recovering an amplified signal from said intermediate frequency signal which is a replica of the low level, low frequency input signal, and automatic frequency control feedback means extending from said discriminator means to said junction points of said varactor pairs for feeding back a corrective frequency control voltage in response to spurious changes in either of said high frequency oscillations.

2. An amplifier as defined in claim 1 including direct current coupling means interconnected between the junction points of said varactor pairs, said coupling means being of an inductive nature to prevent high frequency intercoupling.

3. Apparatus for developing an amplified replica of a low level, low frequency signal comprising a first high frequency oscillator which includes an active element and a frequency-determining tank circuit constituted of a first inductor and a first pair of varactors of which the anodes are connected to the terminals of the inductor and the cathodes are connected together to form a first common point, a second high frequency oscillator which includes an active element and a frequency-determining tank circuit constituted of a second inductor and a second pair of varactors of which the cathodes are connected to the terminals of the second inductor and the anodes are connected together to form a second common point, said inductors being proportioned to cause the oscillations of the first oscillator to differ in frequency from those of the second oscillator by a desired intermediate frequency, means for applying an input signal in parallel to both of said common points whereby a signal voltage increment produces frequency deviations of opposite senses in the frequencies of said oscillators, means for amplifying the output of said oscillators, means for intermodulating said amplified oscillator outputs to develop an intermediate frequency signal having signal-controlled frequency deviations of double magnitude, discriminator means for recovering an amplified signal from said deviated intermediate frequency signal, and an automatic frequency control path of high impedance extending from said discriminator means to said two common points.

4. Apparatus as defined in claim 3 wherein a transistor is utilized as the active element in each of said high frequencsy oscillators.

5. Apparatus as defined in claim 3 wherein the means for applying said input signal includes a third and fourth inductor connected in series between said first common point and said second common point, the junction of said third and fourth inductors being connected to said automatic frequency control path.

6. An apparatus for developing an amplified replica of a low level, low frequency signal comprising a first high frequency oscillator means having an input terminal and an output signal whose frequency deviates in the same sense as the potential applied to the input terminal, a second high frequency oscillator means having an input terminal and an output signal whose frequency is lower than the frequency of the first oscillator output signal by a desired difference frequency and deviates in the opposite sense from that of the potential applied to its respective input terminal, input means for connecting the low frequency signal to be amplified to both of the input terminals in parallel thereby causing the output signal frequencies to deviate in the opposite sense in response to variations in potential at the inputs caused by the low frequency signal, means within the first oscillator means for developing a D.C. potential at the second oscillator means input terminal whose voltage magnitude is dependent on the oscillation frequency of the first oscillator means thereby causing the second oscillator means to track spurious frequency deviations in the first oscillator means, means within the second oscillator means for developing a D.C. potential at the first oscillator means input terminal whose voltage magnitude is dependent on the oscillation frequency of the second oscillator means thereby causing the first oscillator means to track spurious frequency deviations in the second oscillator means, amplifier and intermodulator means connected to receive the output signals of both high frequency oscillators for the purpose of developing a signal at the difference frequency, discriminator means connected to receive the difference frequency signal for the purpose of developing an amplified replica of the low frequency signal, and high impedance feedback means connected between the discriminator means and the input means for developing an automatic frequency control voltage which supplements the tracking caused by the developed D.C. potentials.

7. Apparatus as defined in claim 6 wherein first and second oscillator means each include a pair of series connected back-biased varactors as part of its frequency-determining tank circuit, and the means for developing a D.C. potential in each of said oscillators includes one varactor of said pair.

8. In combination, a first high frequency oscillator including an active element and a frequency-determining tank circuit constituted of a first inductor and a first pair of varactors with their cathodes connected together and their anodes connected to opposite ends of said first inductor, a second high frequency oscillator including an active element and a frequency-determining tank circuit constituted of a second inductor and a second pair of varactors with their anodes connected together and their cathodes connected to opposite ends of said second inductor, said first and second high frequency oscillators having oscillations at frequencies which differ by a desired intermediate frequency, a third and fourth inductor connected in series between the junction of the cathodes of said first varactor pair and the junction of the anodes of said second varactor pair, means connected to the junction of said third and fourth inductors for application of a low level, low frequency signal to said varactor pairs thereby causing the frequencies of the high frequency oscillators to deviate in the opposite sense, means for intermodulating the output signals of both of said high frequency oscillators to develop an intermediate frequency voltage having signal-controlled frequency deviations double in magnitude from that in either of said high frequency oscillators, discriminator means connected to receive the intermediate frequency voltage for recovering an amplified replica of the low frequency signal, means within said discriminator means for developing an automatic frequency control voltage, and feedback means of high impedance carrying the automatic frequency control voltage from said discriminator means to the junction of said third and fourth inductors for correcting the high frequency oscillations when either of the same has undergone a spurious frequency change.

9. The combination as defined in claim 8 including first biasing means for back-biasing the varactors of said first varactor pair at a voltage which allows at least the peaks of the oscillation voltage developed across said first inductor to exceed the back-bias applied to said first varactor pair, and second biasing means for back-biasing the varactors of said second varactor pair at a voltage which allows at least the peaks of the oscillation voltage developed across said second inductor to exceed the back-bias applied to said second varactor pair.

10. The combination as defined in claim 9 wherein the discriminator means includes a first and second transistor connected in common emitter configuration with their bases connected in parallel to receive the intermediate frequency voltage, a pair of resonant tank circuits respectively connected to the collectors of the first and second transistors and adjusted to peak at frequencies respectively higher and lower than the nominal intermediate frequency, a pair of load resistors connected in series, means connecting the end terminals of said resistor pair between the collectors of the first and second transistors, a pair of diodes connected in series with the anode of one connected to the cathode of the other, said series pair of diodes connected in parallel with said load resistor pair, capacitor means connected to the junction of the diodes in said diode pair and across which a replica of said low frequency signal appears, means for supplying a D.C. potential of variable magnitude to the junction of the resistors in said resistor pair, a capacitor of high value having one end connected to the last recited means, and a resistor of high value connected between said capacitor means and the other end of said capacitor of high value, said feedback means of high impedance being connected to the junction of said resistor of high value and said capacitor of high value for receiving an automatic frequency control voltage.

No references cited.

ROY LAKE, *Primary Examiner.*

NATHAN KAUFMAN, *Examiner.*